United States Patent [19]

Fujimura et al.

[11] Patent Number: 4,861,732
[45] Date of Patent: Aug. 29, 1989

[54] METHOD FOR REMOVING AN ION-IMPLANTED ORGANIC RESIN LAYER DURING FABRICATION OF SEMICONDUCTOR DEVICES

[75] Inventors: Shuzo Fujimura, Tokyo; Junichi Konno, Kawasaki, both of Japan

[73] Assignee: Fujitsu Limited, Kawasaki, Japan

[21] Appl. No.: 243,907

[22] Filed: Sep. 13, 1988

[30] Foreign Application Priority Data

Oct. 15, 1987 [JP] Japan .................. 62-259998

[51] Int. Cl.⁴ .................. H01L 21/00; H01L 21/02; H01L 21/30; H01L 21/20
[52] U.S. Cl. .................. 437/229; 437/11; 437/37; 437/20; 148/DIG. 83
[58] Field of Search .................. 437/11, 12, 20, 28, 437/36, 37, 229, 962; 148/DIG. 75, DIG. 83, DIG. 106, DIG. 137

[56] References Cited

U.S. PATENT DOCUMENTS 4,679,308 7/1987 Finn et al. .................. 357/91

FOREIGN PATENT DOCUMENTS 0114742 10/1978 Japan .
0098828 7/1980 Japan .................. 437/229
0101439 6/1983 Japan .................. 437/20
2131226 7/1984 United Kingdom .

*Primary Examiner*—Brian E. Hearn
*Assistant Examiner*—B. Everhart
*Attorney, Agent, or Firm*—Staas & Halsey

[57] ABSTRACT

In the present invention, a method for removing an organic resin material layer reduces residual substances upon removing an ion-implanted organic resin material layer. Inorganic contaminants adhered to the surface of organic resin material layer during ion-implantation are removed by etching, and thereafter, the layer is decomposed and removed by plasma irradiation of the organic resin material layer. An alkaline etchant is used for etching off inorganic contaminants.

18 Claims, 4 Drawing Sheets

METHOD FOR REMOVING AN ION-IMPLANTED ORGANIC RESIN LAYER DURING FABRICATION OF SEMICONDUCTOR DEVICES

BACKGROUND OF THE INVENTION

1. Field of the Invention

The present invention relates generally to a method for fabricating a semiconductor device and, more particularly, to a method for removing an ion-implanted organic resin material layer, such as a resist layer, used as a mask in an ion-implantation process for doping impurities.

2. Description of the Related Art

With improvements in high integration and packing density of a semiconductor integrated circuit (IC) in recent years, an effort has been made to achieve ultra-miniaturization of semiconductor elements and wiring structures as structural elements. As a result, elements in size of 1 μm or less in the smallest region are now in practical use. Such ultra-miniaturization causes amounts of adhesives and contaminants, such as fine dust in the micron size range, to determine the manufacturing yield of ICs in the manufacturing process. Therefore, manufacturing processes require removal of adhesives, residual substances and contaminants as much as possible.

Generally, contamination is reduced by using an ion-implantation impurity doping process. Also, residual substances of such contamination are reduced in the subsequent process for removing the ion-implanted mask.

In the ion-implantation method, it is not required to heat the substrate to a high temperature while the mask is attached, as opposed to other impurity doping methods (for example, the thermal impurity diffusion method). Therefore, it is often the case that an organic photoresist or a polyimide is used as the mask.

After ion-implantation, the mask of unwanted organic resin material layer is removed. However, it is known that the ion-implanted organic resin material layer partly changes its properties due, for example, to carbonization, and cannot be easily stripped. (See Kelvin J. Orvek and Craig Huffman; "CARBONIZED LAYER FORMATION IN ION IMPLANTED PHOTORESIST MASKS", Nuclear Instruments and Methods in Physics Research B7/8 (1985) 501–506)).

In the so-called wet method using a resist stripping solution, the carbonized organic resin material cannot be stripped. Therefore, an oxygen plasma ashing method is generally employed for removal of the ion-implanted organic resin material mask layer. In this case, not only the organic resin material but also carbon formed by carbonization of such material can be oxidized and removed by irradiation of an oxygen plasma.

The carbonized organic resin material layer is effectively removed by such oxygen plasma ashing method. However, when boron (B) or arsenic (As) ions are implanted in high concentrations with dose amounts of about $1 \times 10^{14}$/cm, such method still results in a problem in that a large amount of the organic resin material mask layer remains as a residual substance or stripping residue. If argon (Ar) is ion-implanted, comparatively less stripping residue is left. This is because, for one reason, the impurity itself, such as B or As ions implanted in the mask, is oxidized at the time of oxygen plasma ashing and becomes a non-volatile oxide.

Thus, a method has been developed which uses a plasma which contains hydrogen instead of oxygen, for example, a nitrogen-hydrogen mixing gas plasma, in order to remove B and Ar as volatile hydrogen compounds. According to this method, the stripping residue of the organic resin material mask layer can be reduced by a degree similar to that in the case of an Ar ion-implantation, even when B or As is ion-implanted in high concentrations. However, this method still results in a stripping residue of contaminants having a size of 1 μm or more which is left in amounts as much as about $10^4$ per 1 cm$^2$.

The reasons for causing such stripping residue in amounts noted above, and the methods for reducing the same have not heretofore apparent.

SUMMARY OF THE INVENTION

An object of the present invention is to provide a method for removing ion-implanted organic resin material layer.

It is another object of the present invention to provide a method for reducing the residual substance left after removing an organic resin material layer used as the mask in the ion-implantation process and thereby improving manufacturing yield of a semiconductor device such as IC.

These objects are attained by providing a method which includes removing by etching inorganic contaminants such as Al and Al$_2$O$_3$, adhered to a surface of an organic resin material layer such as organic resist layer during the ion-implantation, during removal of an non-implanted organic resin material layer such as organic resist layer used as the mask in the ion-implantation process. Thereafter, the organic resin material layer is removed by irradiation of a plasma, such as an oxygen plasma and plasma containing hydrogen. Since the inorganic contaminants adhered to the surface of organic resin material layer, such as resist layer during ion-implantation, is mainly formed by Al and Al$_2$O$_3$, these may be removed by processing with an alkaline etching solution. The remaining organic resin material layer, such as organic resist layer, carbide thereof, and impurities such as B and As implanted in the organic resin material layer, are changed to a volatile compound and are removed by irradiation of plasma.

Thus, the organic contaminant is no longer left as the residual substance and the amount of residual substance after removal of organic resin material layer used as the mark for ion-implantation is reduced.

In addition, since the organic contaminant is removed by dissolving it with an etchant, damage to the substrate is avoided.

These objects, together with other objects and advantages which will be subsequently apparent reside in the details of construction and operation of the method as more fully hereinafter described and claimed, reference being had to the accompanying drawings forming a part hereof, wherein like reference numerals refer to like parts throughout.

DETAILED DESCRIPTION OF THE PREFERRED EMBODIMENTS

Figure 2:
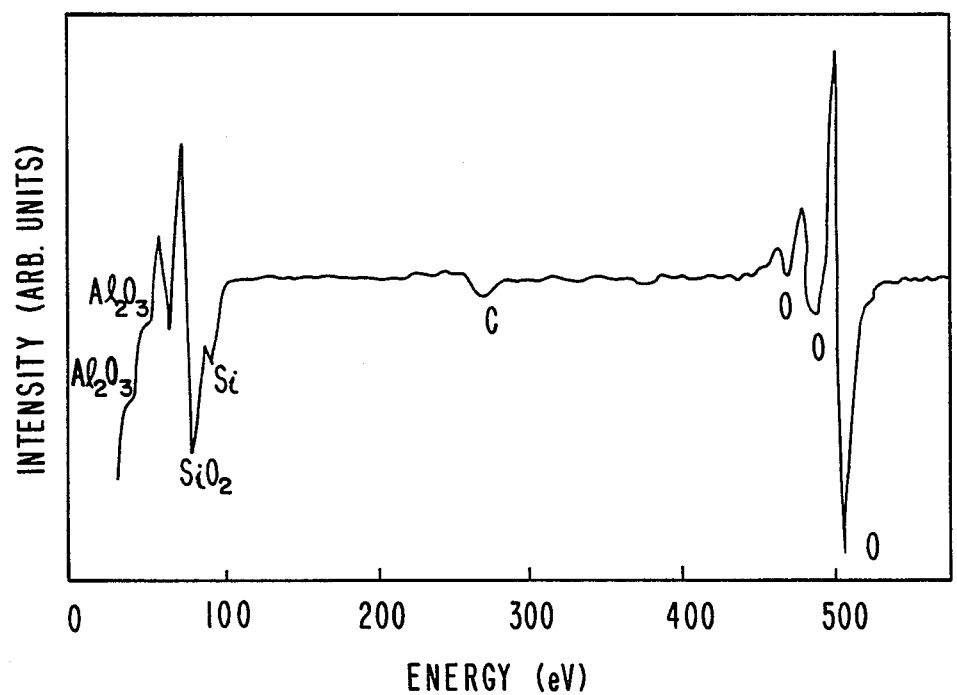
FIG. 2 is a graph illustrating an AES spectrum of a residual substance of ion-implanted organic resist layer.

The inventors of the present invention have ion-implanted Ar ions in concentrations of about $1 \times 10^{17}/cm^2$ in a silicon substrate coated with a positive photoresist, then irradiated such substrate with an oxygen plasma to remove the ashed resist layer. Thereafter, the inventors analyzed the remainder on the silicon substrate by the Auger electron spectroscopy (AES) method. As a result, as shown in FIG. 2, it has been determined that the residual substance contains carbon (C), aluminum (Al), and aluminum oxide ($Al_2O_3$).

For comparison, if oxygen plasma ashing is carried out to the substrate to which only the resist layer is attached but ion-implantation is not carried out, the residual substance is left in an amount of about $10^2$ per 1 $cm^2$, which is about 1/100 that of the substrate to which the ion-implantation has been conducted. Therefore, it was concluded that Al and/or $Al_2O_3$ does not result from the impurity contained in the resist.

It is possible that Al and $Al_2O_3$ in the residual substance is introduced in the process of ion-implantation, but this poses the problem of determining from what these are formed.

It has been reported that when oxygen are implanted in very high doses of about $1 \times 10^{18}/cm^2$, aluminum, which is a constituent material of the ion-implantation apparatus, is sputtered by the accelerated ions and aluminum thereby adheres to the substrate. (S. Nakashima, I. Kawashima and K. Izumi; "AN ANALYSIS OF CONTAMINATION IN HIGH DOSE OXYGEN ION IMPLANTATION AND A CONTAMINATION-PROOF TECHNIQUE" Proc. 9th Symp. on ISIAT'85 (1985) 203-206).

Figure 3A:
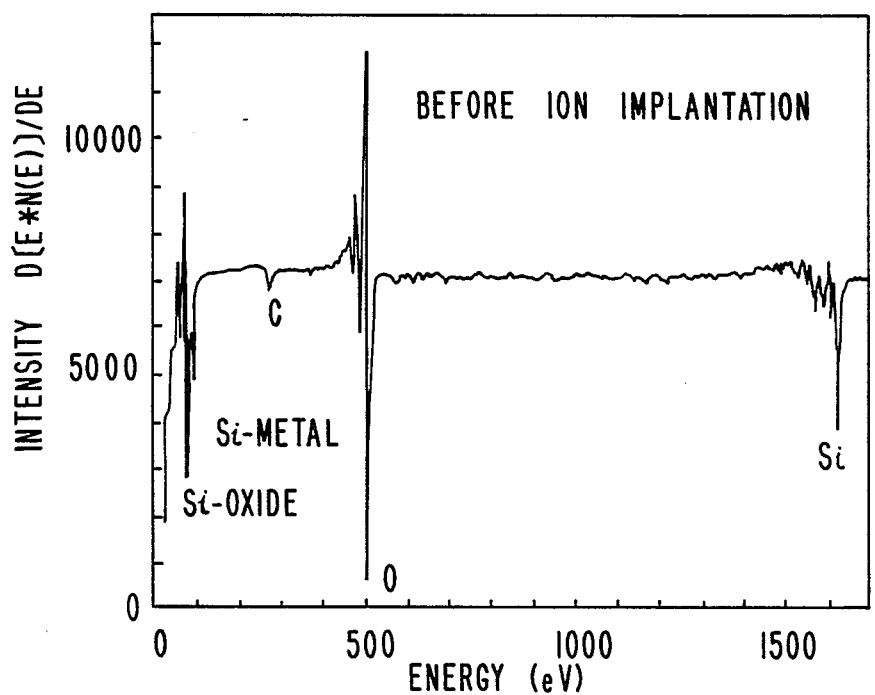
FIGS. 3a and 3b are graphs illustrating AES spectra of the surface of a silicon substrate before and after implantation of Ar ions.
Figure 3B:
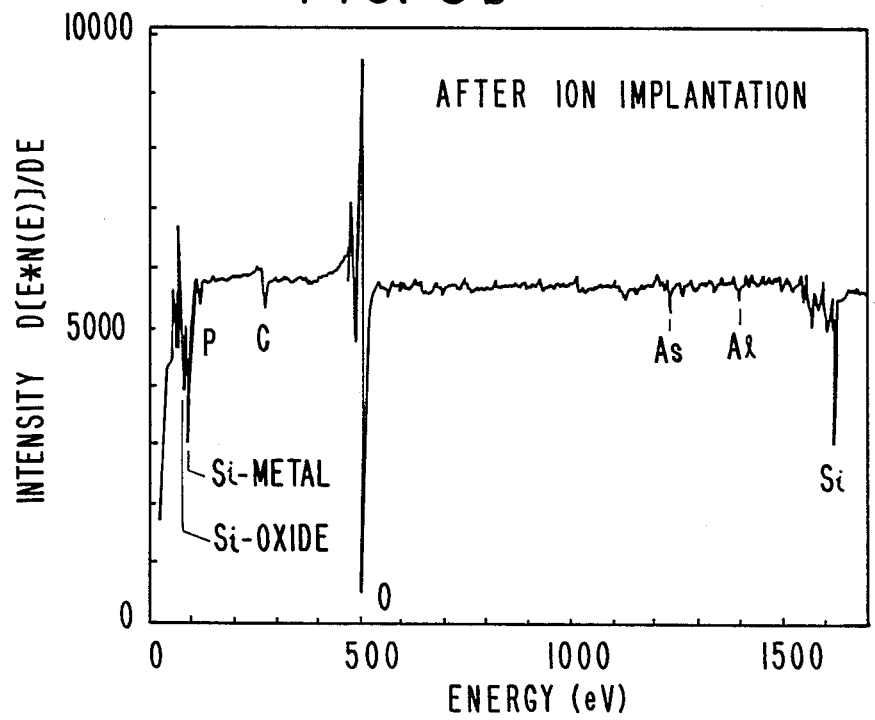

Therefore, the inventors have doped Ar ions to the silicon substrate in the concentration of $1 \times 10^{17}/cm^2$ and compared and analyzed the AES spectra by taking readings before and after ion-implantation. As shown in FIG. 3a, before ion-implantation, only silicon (Si), carbon (C) and oxygen (0) are detected at the surface of the substrate. However, aluminum is detected, as shown in FIG. 3b, at the surface of the substrate after ion-implantation. In addition to aluminum, P and As are also detected. The reason may be that the interior of the ion-implantation apparatus is contaminated by P and As since the same apparatus has been previously used for P and As ion implantation.

Figure 4A:
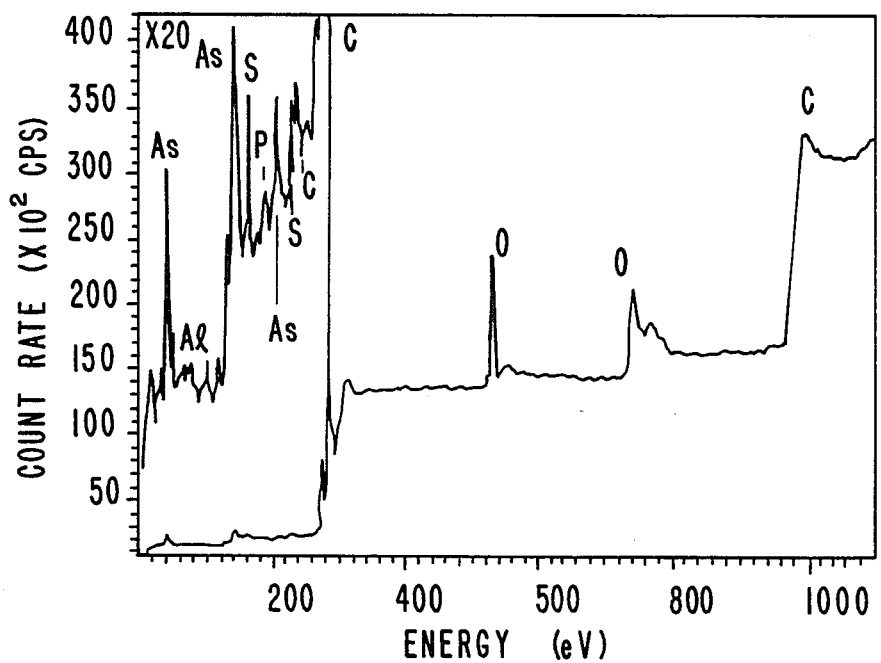
FIGS. 4a and 4b are graphs illustrating XPS spectra at the surface of an Ar ion implanted resist layer.
Figure 4B:
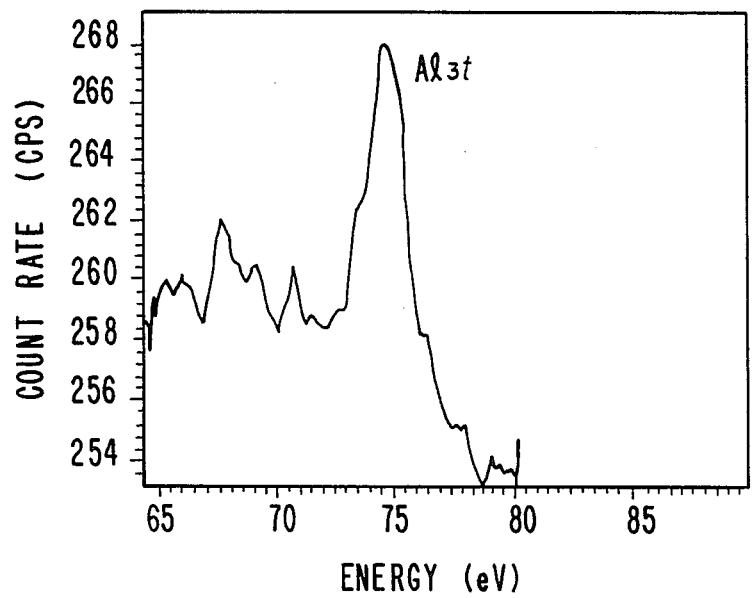

Meanwhile, in another analysis of the surface of resist layer using an X-ray photoelectron spectroscopy (XPS) method before and after Ar ion-implantation, in which a positive photoresist layer is attached to the silicon substrate, aluminum is not detected at the surface of the resist layer before ion-implantation, but is detected after ion-implantation as shown in FIGS. 4a and 4b. From the reaction conditions, it is believed that a greater part of aluminum changes to $Al_2O_3$. In the XPS spectrum, As, P and S can also be detected in addition to aluminum. This may be due to the fact that the ion-implantation apparatus is contaminated by As, P and S used previously, and contaminants adhered to the apparatus are sputtered by ion-bombardment during Ar ion-implantation and then adhered again to the resist layer.

Moreover, XP analysis during etching from the surface of the resist layer has proven that aluminum exists only in a region of the resist layer which extends to a depth of about 250 Å from the surface exposed to bombardment.

Similar AES analysis and XPS analysis has been conducted for samples where B and As ions are ion-implanted instead of Ar ions. The results are substantially the same as in the case where Ar ions are used.

From the above experimental results, conclusions may be drawn through inorganic contaminants such as Al and $Al_2O_3$ sputtered from the structural elements of an ion-implantation apparatus are adhered to the surface of resist layer during ion-implantation. After the resist layer is decomposed and removed by the plasma, some resist remains on the substrate as the residual substance since such inorganic contaminants do not change to volatile compounds even if it is irradiated with plasma containing oxygen and hydrogen.

The present invention has been proposed on the basis of the aspects newly found by the same inventors of the invention explained above.

FIG. 1 schematically illustrates an example of a method according to the present invention for removing an ion-implanted organic photoresist layer after ion-implantation of Ar ions to the organic photoresist layer formed on a silicon substrate.

Figure 1A:
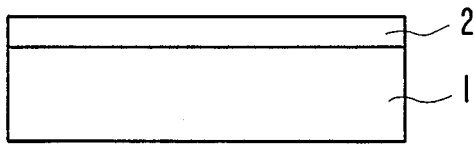
FIGS. 1a–1e are sequential schematic views, illustrating the steps of the processes for removing ion-implanted organic resin material layer according to the present invention.

Substrate 1 is a silicon substrate about four inches in diameter and has a surface orientation of (100), with one surface polished like a mirror surface. Such a silicon substrate is per se known. A positive organic photoresist, such as HPR-204 (made by Fuji Hunt Electronics Technology Co. Ltd. of Tokyo, Japan), is deposited on a mirror-polished surface of the substrate 1 as a resist coating having a thickness of about 2 μm using the well known spin coater. Photoresists are commercially available. Thereafter, the substrate 1 is baked for about 2 minutes at about 140° C. using a hot plate in a dry nitrogen gas ambient to form the resist layer 2 (FIG. 1a). The positive organic photoresist is preferably formed by dissolving the main component of a novolak resin into an organic solvent. A novolak resin is a thermoplastic phenol-formaldehyde resin made with an excess of phenol in the reaction. If the resist layer is used as the mask for ion-implantation, such resist layer 2 must be formed in a sufficient thickness, such that the ions to be implanted do not go therethrough and thereby do not reach the substrate 1. The thickness of the resist layer 2 can be changed by adjusting the viscosity of the resist solution used, the amount of resist to be deposited and/or the number of rotations during the coating. According to the present invention, the resist layer 2 is an organic resin material layer which must be formed in such a thickness that it can be used as the mask for ion-implantation and can be decomposed and removed by an oxygen plasma and a plasma containing hydrogen.

An organic photoresist other than the novolak resin can also be used in the same way. Moreover, in case a heat resistant mask is required, an organic resin material layer having excellent heat resistivity, such as a polyimide, can be used.

In case an organic resin material layer is used as the mask for ion-implantation, it is sufficient to form an opening of the desired shape by the well known photolithographic methods. If an organic resin material layer having no photosensitivity, such as a polyimide, is used, a photoresist layer is formed thereon and the well known photolithographic methods are applied. The organic resin material layer may be formed in the multilayer structure as required.

Figure 1B:
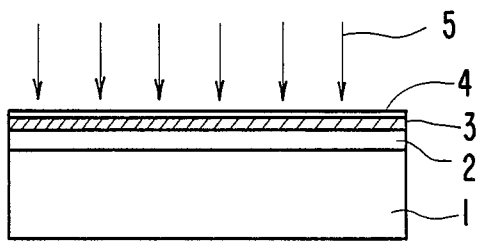
Figure 1C:
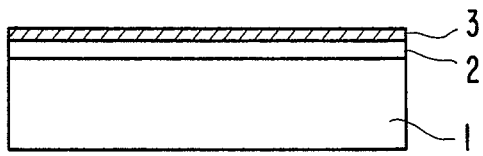
Figure 1D:
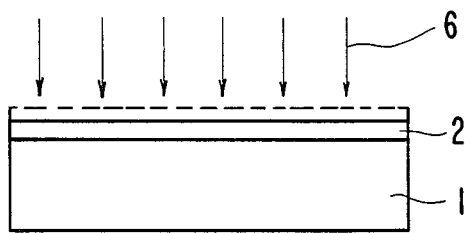

After forming the resist layer 2 as described above, Ar ions 5 are implanted in the surface of resist layer 2 with the acceleration energy of 70 keV and at a dose of about $1 \times 10^{17}/cm^2$ The resist layer 2 is carbonized and resist carbonized layer 3 is formed by such ion-implantation. Simultaneously, inorganic contaminants 4 consisting of Al or $Al_2O_3$ are adhered to the layer 3 (FIG. 1b).

The degree of carbonization of the resist layer 2 and adhesion of inorganic contaminants depends on the kind of ion to be implanted, acceleration energy and dose. In general, the higher the acceleration energy and dose, the more resist layer 2 will be carbonized and the more inorganic contaminants will be adhered thereon. If B, As, P, and Ar ions are implanted with the acceleration energy of about 50 to 200 keV, and if the dose rate exceeds $1 \times 10^{14}/cm$, adhesion of inorganic contaminants seems to have a negligible effect on a rate of the amount of residual substances associated with resist layer.

For removal of the resist layer 2, the substrate is immersed for about five minutes in an etchant which is obtained by diluting 10 cc of 28% (weight percent) aqueous solution of ammonium hydroxide ($NH_4OH$) with 1000 cc of deionized water. Thereafter, the substrate is bubble-rinsed with the deionized water for ten minutes and then dried by blowing dry nitrogen gas. Since Al and $Al_2O_3$, which are the main elements of inorganic contaminant, react with $NH_4OH$ and dissolve into the etchant, the inorganic contaminants 4 adhered during ion-implantation are removed. In this etching process, it is preferable to stir the solvent by applying an ultrasonic wave in order to improve the efficiency of the reaction.

It was considered whether to employ a sputter etching method for carrying out the etching step for removing inorganic contaminants adhered to the surface of the organic resin material layer during ion-implantation. However, this method can potentially damage the portions of the surface of substrate not covered with the resist layer by ion bombardment and may also bury inorganic contaminants adhered to the substrate surface. If inorganic contaminants are dissolved with an etchant, as in the present invention, damage to the substrate is avoided.

Figure 1E:

Thereafter, the substrate is irradiated with an oxygen plasma 6 for 60 minutes under conditions such that the oxygen flow rate is 200 sccm (cubic centimeters per minute at standard conditions, that is 0° C. and 1 atmosphere), pressure is 1 Torr, frequency is 13.56 MHz and high frequency input is 300W, using the well known barrel type high frequency plasma asher in order to remove the resist carbonized layer 3 and resist layer 2 (FIG. 1e). Details of apparatus capable of use for plasma processing are explained in a paper by the inventors of the present invention (S. Fujimura, H. Yano, S. Mochizuki and K. Ogawa; "HEAVY METAL CONTAMINATION FROM RESISTS DURING PLASMA STRIPPING", 1986 Dry Process Symposium (1986) III -2, 67–73).

In the case of the present invention, an oxygen plasma processing is preferred because Ar ions are implanted. However, if B or As ions are implanted, it is desirable to conduct the processing with the plasma containing hydrogen (as explained above).

Experiments conducted after removing resist carbonized layer 3 and resist layer 2 reveal that about 4,385 residues (on average), in the size range of about 1 μm or more are found per 1 $cm^2$ of the substrate 1 by counting with a particle counter (WIS-150; Aeronca Electronics Inc.) which is commercially available. If the resist layer 2 is removed only with the oxygen plasma processing under the same conditions except for the etching process prior to the plasma processing, 5,788 residues (on average) in the range of about 1 μm or more, can be found on 1 $cm^2$ on the substrate 1.

Since a value counted by the particle counter includes dust adhered to the substrate and damage to the substrate applied after the oxygen plasma processing, the residual substance of resist stripping by the method of the present invention can be reduced by 75 percent or more compared to other methods.

Similar results have also been obtained even by using 0.2N of potassium hydroxide (KOH) as the etchant in place of the diluted ammonium hydroxide.

As a matter of course, the concentration of etchant and etching time can be optimized depending on dose rate of ion-implantation. In addition, other etchants which do not damage the substrate yet dissolve inorganic contaminants may be used.

Also, the present invention is effective irrespective of kind of substrate, kind of impurity to be doped and kind of organic resin material layer. The present invention is not restricted in the application field and can be generally applied for removing ion-implanted organic resin material layers.

According to the present invention, as is apparent from the above description, the amount of residual substance on the substrate can be reduced in a process for removing an organic resin material layer used as the mask for ion-implantation and therefore the present invention results in a remarkably improved manufacturing yield for semiconductor devices such as an IC.

The many features and advantages of the present invention are apparent from the detailed specification, and thus, it is intended by the appended claims to cover all such features and advantages of the method which fall within the true spirit and scope of the invention. Further, since numerous modifications and changes will readily occur to those skilled in the art based upon the disclosure herein, it is not desired to limit the invention to the exact construction and operation illustrated and described. Accordingly, all suitable modifications and equivalents may be resorted to falling within the scope and the spirit of the invention.

What we claim is:

1. A method of making semiconductor devices, comprising the steps of:
    forming an organic material layer on a substrate, the organic material layer being made of an organic resin capable of being removed by a plasma;
    implanting ions in the organic material layer, thereby forming an inorganic contamination layer on a surface of the organic material layer;
    etching off the inorganic contamination layer with an etching solution; and
    after etching, exposing the substrate with the organic material layer to a plasma capable of removing the organic material layer by decomposition of the organic material.

2. A method of making semiconductor devices according to claim 1, further comprising stirring the etching solution during etching.

3. A method of making semiconductor devices according to claim 2, further comprising rinsing the substrate after etching.

4. A method of making semiconductor devices according to claim 3, wherein the etching step comprises etching with an alkaline etching solution.

5. A method of making semiconductor devices according to claim 4, wherein the etching step comprises etching with a solution which includes ammonium hydroxide.

6. A method of making semiconductor devices according to claim 4, wherein the etching step comprises etching with a solution which includes potassium hydroxide.

7. A method of making semiconductor devices according to claim 1, wherein the exposing step comprises exposing the organic material layer to a plasma which includes oxygen.

8. A method of making semiconductor devices according to claim 1, wherein the exposing step comprises exposing the organic material layer to a plasma which includes hydrogen.

9. A method of making semiconductor devices according to claim 1, wherein the forming step comprises forming an organic photoresist layer.

10. A method of making semiconductor devices according to claim 1, wherein the step of implanting ions comprises implanting at a dose rate of at least $10^{14}/cm^2$.

11. A method for removing from a substrate an organic resin layer having an inorganic contamination layer formed by ion-implantation of the organic resin, the method comprising:
   etching off the inorganic contamination layer with an etching solution; and
   after etching, exposing the substrate with the organic material layer to a plasma capable of removing the organic material layer by decomposition of the organic material.

12. A method of making semiconductor devices according to claim 11, further comprising stirring the etching solution during etching.

13. A method of making semiconductor devices according to claim 12, further comprising rinsing the substrate after etching.

14. A method of making semiconductor devices according to claim 13, wherein the etching step comprises etching with an alkaline etching solution.

15. A method of making semiconductor devices according to claim 14, wherein the etching step comprises etching with a solution which includes ammonium hydroxide.

16. A method of making semiconductor devices according to claim 15, wherein the etching step comprises etching with a solution which includes potassium hydroxide.

17. A method of making semiconductor devices according to claim 11, wherein the exposing step comprises exposing to a plasma which includes oxygen.

18. A method of making semiconductor devices according to claim 11, wherein the exposing step comprises exposing to a plasma which includes hydrogen.

* * * * *